US012648195B2

(12) United States Patent
Mariottini et al.

(10) Patent No.: US 12,648,195 B2
(45) Date of Patent: Jun. 2, 2026

(54) SUBFINS REPLACED USING BACKSIDE DIELECTRIC FORMATION

(71) Applicant: Intel Corporation, Santa Clara, CA (US)

(72) Inventors: Giorgio Mariottini, Hillsboro, OR (US); Jamie Wilt, Tualatin, OR (US); Anbusathaiah Varatharajan, Portland, OR (US); Jaladhi Mehta, Beaverton, OR (US); Alexander Kane, Forest Grove, OR (US); Amish B. Shah, Portland, OR (US); Weihong Gao, Portland, OR (US); Aurelia Chi Wang, Hillsboro, OR (US); Conor P. Puls, Portland, OR (US); Claire Mcghee, Hillsboro, OR (US); Sayan Sarkar, Cornelius, OR (US); Eric Young, Hillsboro, OR (US); Timothy Lyon, Aloha, OR (US); Chun-Kuo Huang, Portland, OR (US); Warren Gray, Oregon City, OR (US); Angel R. Aquino Gonzalez, Beaverton, OR (US); Daniel J. Harris, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 395 days.

(21) Appl. No.: 18/216,891

(22) Filed: Jun. 30, 2023

(65) Prior Publication Data

US 2026/0075894 A1 Mar. 12, 2026

(51) Int. Cl.
*H10D 62/10* (2025.01)
*H10D 30/67* (2025.01)

(52) U.S. Cl.
CPC ....... *H10D 62/121* (2025.01); *H10D 30/6735* (2025.01)

(58) Field of Classification Search
CPC ... H10D 30/6735; H10D 62/121; H10D 30/43
See application file for complete search history.

(56) References Cited

U.S. PATENT DOCUMENTS

2017/0194143 A1* 7/2017 Balakrishnan .... H01L 21/02603
2018/0108526 A1* 4/2018 Mitard ................ H10D 62/121
(Continued)

*Primary Examiner* — Changhyun Yi
(74) *Attorney, Agent, or Firm* — Arcane Law PLLC

(57) ABSTRACT

Techniques are provided herein to form semiconductor devices that have their semiconductor subfins removed and replaced with one or more dielectric materials. A semiconductor device includes a gate structure around or otherwise on a semiconductor region. A lower end of the semiconductor material includes a subfin adjacent to a dielectric layer that acts as shallow trench isolation (STI) between semiconductor devices. A backside process may be performed to remove the bulk substrate and expose a bottom surface of the subfin. The subfin may then be removed from the backside to form backside recesses. A dielectric liner may be formed within the backside recesses and a dielectric fill may be formed within a remaining volume of the backside recesses. Replacing the subfins with dielectric materials may lower parasitic capacitance between the subfins and the gate electrodes as well as reduce parasitic current between adjacent source or drain regions.

20 Claims, 10 Drawing Sheets

(56) References Cited

U.S. PATENT DOCUMENTS

| | | | | |
|---|---|---|---|---|
| 2019/0057867 | A1* | 2/2019 | Smith | H01L 21/32133 |
| 2020/0357703 | A1* | 11/2020 | Lee | H10D 30/6735 |
| 2021/0343639 | A1* | 11/2021 | Wang | H01L 21/76897 |
| 2022/0416035 | A1* | 12/2022 | Chu | H10D 30/014 |
| 2024/0321959 | A1* | 9/2024 | Xie | H10D 30/014 |

* cited by examiner

500

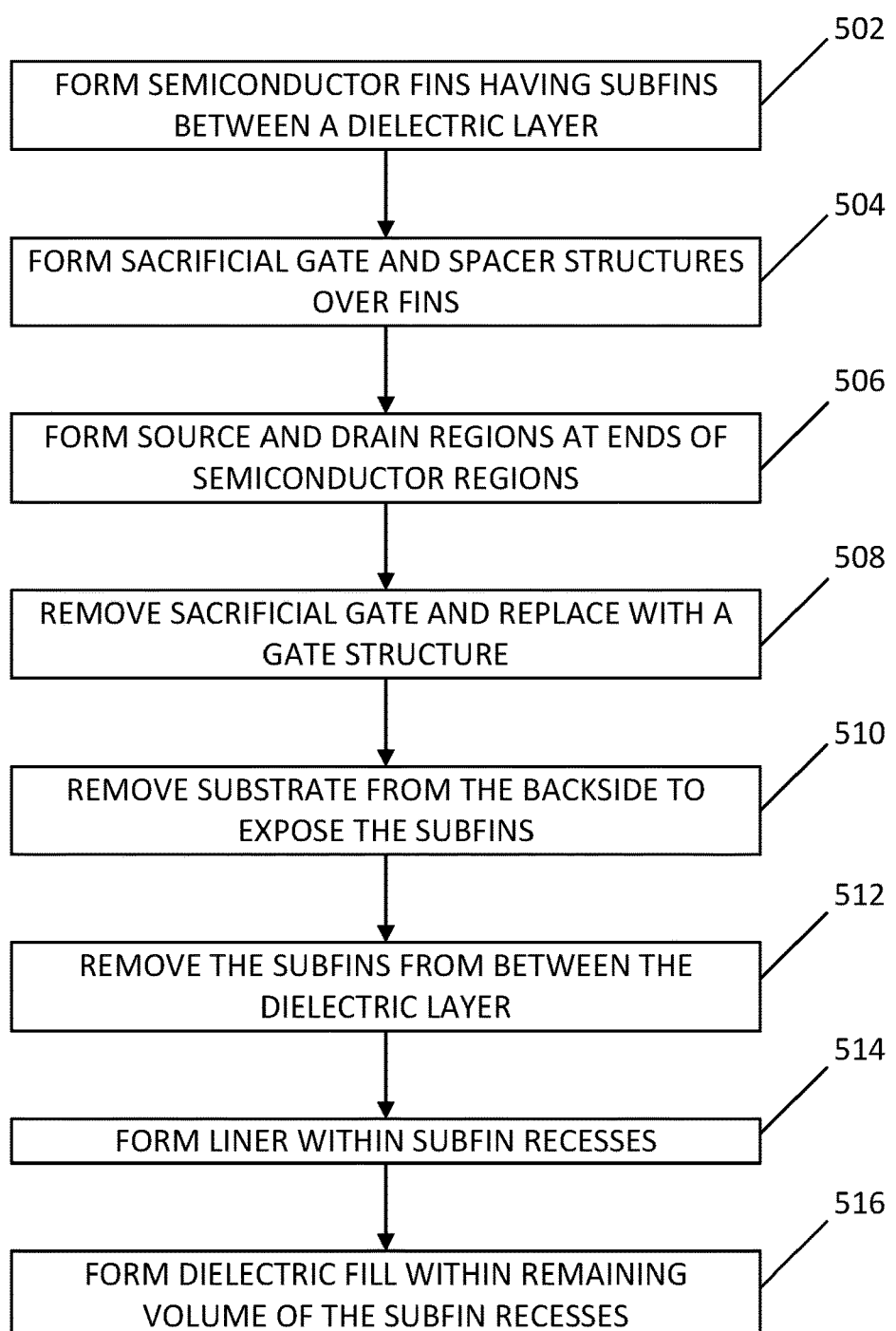

502

FORM SEMICONDUCTOR FINS HAVING SUBFINS
BETWEEN A DIELECTRIC LAYER

504

FORM SACRIFICIAL GATE AND SPACER STRUCTURES
OVER FINS

506

FORM SOURCE AND DRAIN REGIONS AT ENDS OF
SEMICONDUCTOR REGIONS

508

REMOVE SACRIFICIAL GATE AND REPLACE WITH A
GATE STRUCTURE

510

REMOVE SUBSTRATE FROM THE BACKSIDE TO
EXPOSE THE SUBFINS

512

REMOVE THE SUBFINS FROM BETWEEN THE
DIELECTRIC LAYER

514

FORM LINER WITHIN SUBFIN RECESSES

516

FORM DIELECTRIC FILL WITHIN REMAINING
VOLUME OF THE SUBFIN RECESSES

FIG. 5

SUBFINS REPLACED USING BACKSIDE DIELECTRIC FORMATION

FIELD OF THE DISCLOSURE

The present disclosure relates to integrated circuits, and more particularly, to subfins of semiconductor devices.

BACKGROUND

As integrated circuits continue to scale downward in size, a number of challenges arise. For instance, reducing the size of memory and logic cells is becoming increasingly more difficult, as is reducing device spacing at the device layer. As transistors are packed more densely, parasitic effects can increasingly impact the device operation in an undesirable way. Accordingly, there remain a number of non-trivial challenges with respect to forming semiconductor devices.

BRIEF DESCRIPTION OF THE DRAWINGS

FIG. 2I' is another cross-sectional view of the semiconductor devices from FIG. 2I with subfins replaced with one or more dielectric materials and an airgap, in accordance with some embodiments of the present disclosure.

FIG. 5 is a flowchart of a fabrication process for semiconductor devices with subfins replaced with one or more dielectric layers, in accordance with an embodiment of the present disclosure.

Figure 1A:
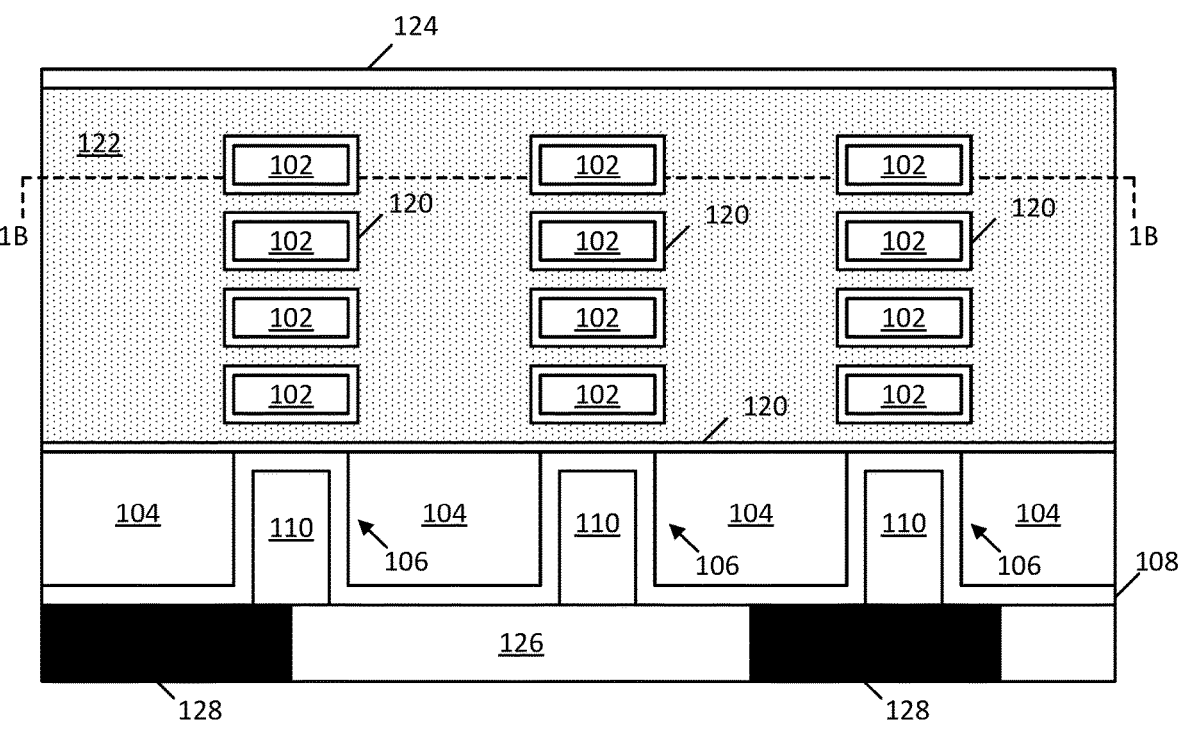
FIGS. 1A and 1B are cross-sectional and plan views, respectively, of some semiconductor devices with subfins replaced with one or more dielectric layers, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form semiconductor devices that have their semiconductor subfins removed and replaced with one or more dielectric materials. The techniques can be used in any number of integrated circuit applications and are particularly useful with respect to device layer transistors, such as finFETs or gate-all-around transistors (e.g., ribbonFETs and nanowire FETs). In an example, a semiconductor device includes a gate structure around or otherwise on a semiconductor region. The semiconductor region can be, for example, a fin of semiconductor material that extends from a source region to a drain region, or one or more nanoribbons or nanoribbons or nanosheets of semiconductor material that extend from a source region to a drain region. A lower end of the fin of semiconductor material includes a subfin adjacent to a dielectric fill that acts as shallow trench isolation (STI) between semiconductor devices. A backside process may be performed to remove the bulk substrate and expose a bottom surface of the subfin. The subfin may then be removed from the backside to form backside recesses. A dielectric liner may be deposited within the backside recesses, and a dielectric fill may be deposited within a remaining volume of the backside recesses. Depending on factors such as the deposition process and the height-to-width aspect ratio of the backside recesses, pinch-off may occur during the dielectric fill deposition process, thereby creating an airgap or void within the subfin location. Replacing the subfins with one or more dielectric materials (including any airgap or void) may lower parasitic capacitance between the subfins and the gate electrodes as well as reduce parasitic current between adjacent source or drain regions. Numerous variations and embodiments will be apparent in light of this disclosure.

General Overview

As previously noted above, there remain a number of non-trivial challenges with respect to integrated circuit fabrication. In more detail, as devices become smaller and more densely packed, semiconductor subfins beneath semiconductor regions of the devices can form parasitic junctions between source or drain regions, as at least a portion of the source or drain regions may abut the subfins. Furthermore, the subfins can accumulate charge and form parasitic capacitors with adjacent gate structures. In operation, these parasitic effects can reduce the switching speed of the transistors and degrade the overall performance.

Thus, and in accordance with an embodiment of the present disclosure, techniques are provided herein to remove the semiconductor substrates from the backside of the structure and replace the subfins with one or more dielectric materials. In some embodiments, the subfins may be a semiconductor material, such as silicon (Si), that is a part of the semiconductor substrate. A bulk portion of the semiconductor substrate may be removed from the backside of the structure to expose the subfins from the bottom. Once exposed, an etch process may be performed to selectively remove the semiconductor material of the subfins, thus leaving behind backside recesses beneath the semiconductor devices. The backside recesses may be filled or partially filled with various dielectric material, such as a dielectric liner and dielectric fill. The dielectric liner may include any number of deposited dielectric layers that can include silicon nitride, silicon dioxide, silicon carbide, silicon oxycarbide, silicon oxynitride, silicon oxycarbonitride, or aluminum oxide, to name a few examples. The liner may have a total thickness, for example, between about 1 nm and about 6 nm. In some embodiments, the dielectric fill can also include any of silicon nitride, silicon dioxide, silicon carbide, silicon oxycarbide, silicon oxynitride, silicon oxycarbonitride, or aluminum oxide, to name a few examples. In some embodiments, the dielectric fill is deposited in such a way that an airgap or void is created in a central portion of the backside recess. By replacing the semiconductor subfins with dielectric materials (possibly including a void or airgap), the parasitic capacitance and leakage current are reduced, thus improving the performance of the transistors.

According to an embodiment, an integrated circuit includes a semiconductor region extending from a source or drain region in a first direction, a gate structure extending over the semiconductor region in a second direction different from the first direction, a dielectric layer beneath the gate structure, and a subregion directly beneath the semiconductor region and adjacent to the dielectric layer. The subregion includes a dielectric liner along edges of the subregion and a dielectric fill within at least a portion of a remaining volume of the subregion, such that the dielectric liner is between the dielectric layer and the dielectric fill. Such a visual distinction may be detectable via imaging equipment, given that the dielectric materials are deposited at different times.

According to another embodiment, an integrated circuit includes a subregion of a semiconductor device. The subregion is beneath a semiconductor region and adjacent to a dielectric layer. The integrated circuit also includes a gate structure over the semiconductor region such that both the subregion and the dielectric layer are beneath the gate structure. The subregion includes a dielectric liner along edges of the subregion and a dielectric fill within at least a portion of a remaining volume of the subregion. The dielectric liner is between the dielectric layer and the dielectric fill.

According to another embodiment, an integrated circuit includes a gate trench having a bottom surface, a nanowire or nanoribbon within the gate trench and above the bottom surface, a gate dielectric wrapped around the nanowire or nanoribbon. The gate dielectric is on the bottom surface of the gate trench. The integrated circuit also includes a gate electrode within the gate trench and on the gate dielectric and a layer of dielectric material below the gate dielectric that is on the bottom surface of the gate trench. The layer of dielectric material has a recess therein that lands on a backside of the gate dielectric that is on the bottom surface of the gate trench. The integrated circuit also includes a dielectric liner within the recess, and a dielectric fill within at least a portion of a remaining volume of the recess, such that the dielectric liner is between the layer of dielectric material and the dielectric fill.

According to another embodiment, a method of forming an integrated circuit includes forming a multilayer fin extending in a first direction over a substrate having a first section with first material layers alternating with second material layers, and a subfin beneath the first section; forming a dielectric layer adjacent to the subfin; forming a sacrificial gate and spacers on sidewalls of the sacrificial gate, the sacrificial gate extending in a second direction over the multilayer fin, the second direction being different from the first direction; removing an exposed portion of the multilayer fin adjacent to the sacrificial gate to form a first recess through the multilayer fin; forming a source or drain region from ends of the second material layers and within the first recess; replacing the sacrificial gate with a gate structure; removing a portion of the substrate from the backside to expose a bottom surface of the subfin; removing the subfin from the backside to form a second recess through the dielectric layer; forming a dielectric liner along one or more edges of the second recess; and depositing a dielectric fill within at least a portion of a remaining volume of the recess.

The techniques can be used with any type of non-planar transistors, including finFETs (sometimes called tri-gate transistors), nanowire and nanoribbon transistors (sometimes called gate-all-around transistors), or forksheet transistors, to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the absence of semiconductor subfins beneath the semiconductor regions of the transistors. In place of the subfins, one or more dielectric layers may be observed, including a dielectric liner along the sides of the recesses where the subfins used to be. Sidewalls of the recesses may be co-linear with sidewalls of a gated channel region above, indicating that the recess and gated channel region portions were derived from a common fin structure. In some examples, an airgap or void may be observed within the recesses where the subfins used to be.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer. A space or volume that is at least partially within a given layer and devoid of any solid fill materials may be referred to herein as an airgap or a void (used interchangeably herein). Such an airgap or void may be filled with one or more gasses (e.g., oxygen, nitrogen, air, to name a few examples), or be devoid of any gases.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

Figure 1B:
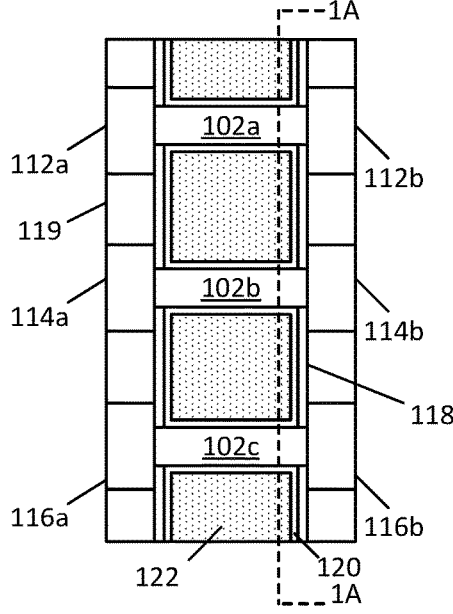

FIG. 1A is a cross-sectional view taken across three example semiconductor devices, according to an embodiment of the present disclosure. FIG. 1B is a plan view of the adjacent semiconductor devices taken across the dashed line 1B-1B depicted in FIG. 1A, and FIG. 1A illustrates the cross-section taken across the dashed line 1A-1A depicted in FIG. 1B. It should be noted that some of the material layers (such as dielectric cap 124) are not visible in the top-down view of FIG. 1B, given the location of the depicted cross-section. Each of the semiconductor devices may be non-planar metal oxide semiconductor (MOS) transistors, such as tri-gate (e.g., finFET) or gate-all-around (GAA) transistors, although other transistor topologies and types could also benefit from the techniques and structures provided herein. The illustrated example embodiments herein use the GAA structure. The illustrated semiconductor devices represent a portion of an integrated circuit that may contain any number of similar semiconductor devices.

Each of the semiconductor devices includes one or more nanoribbons 102 that extend parallel to one another along a direction between a source region and a drain region (e.g., a first direction into and out of the page in the cross-section view of FIG. 1A). Nanoribbons 102 are one example of semiconductor regions or semiconductor bodies that extend between source and drain regions. The term nanoribbon may also encompass other similar shapes such as nanowires or nanosheets. The semiconductor material of nanoribbons 102 may be formed from a substrate. In the illustrated example, the substrate has been removed from the backside thus exposing a bottom surface of a dielectric layer 104 that provides shallow trench isolation (STI) between any adjacent semiconductor devices. Dielectric layer 104 can be any suitable dielectric material, such as silicon dioxide, silicon nitride, or silicon oxycarbonitride. Any number of backside interconnect structures may be formed under dielectric layer 104 to provide backside power or signal routing for the semiconductor devices.

In some embodiments, the semiconductor devices may each include semiconductor regions in the shape of fins that can be, for example, native to the substrate (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 102 during a gate forming process where one type of the alternating layers is selectively etched away so as to liberate the other type of alternating layers within the channel region, so that a gate-all-around (GAA) process can then be carried out. Again, the alternating layers can be blanket deposited and then etched into fins or deposited into fin-shaped trenches, according to some examples.

Each of the semiconductor devices may include a subregion 106. According to some embodiments, subregion 106 encompasses the region that was occupied by a semiconductor subfin that was removed during a backside process. Subregion 106 may include a dielectric liner 108 and a dielectric fill 110, according to some embodiments. Dielectric liner 108 may extend along the edges of subregion 106 directly abutting sidewalls of dielectric layer 104. Dielectric liner 108 may include silicon and any one or more of nitrogen, carbon, or oxygen, and may have a thickness between about 1 nm and about 6 nm. According to some embodiments, dielectric liner 108 is on the bottom surfaces of dielectric layer 104 between adjacent subregions 106. Dielectric fill 110 may similarly include silicon and any one or more of nitrogen, carbon, or oxygen. In some embodiments, dielectric fill 110 includes an airgap within a central portion of dielectric fill 110.

According to some embodiments, nanoribbons 102 (or other semiconductor bodies) extend between a source and a drain region in the first direction to provide an active region for a transistor (e.g., the semiconductor region beneath the gate). The source and drain regions are not shown in the cross-section of FIG. 1A, but are seen in the top-down view of FIG. 1B where nanoribbons 102a of a first semiconductor device extend between a source region 112a and a drain region 112b, nanoribbons 102b of a second semiconductor device extend between a source region 114a and a drain region 114b, and nanoribbons 102c of a third semiconductor device extend between a source region 116a and a drain region 116b. Any source region may also act as a drain region and vice versa depending on the circuit configuration. FIG. 1B also illustrates spacer structures 118 that extend around the ends of nanoribbons 102 and along sidewalls of the gate structures between spacer structures 118. Spacer structures 118 may include a dielectric material, such as silicon nitride. A dielectric fill 119 may be present between adjacent source or drain regions along the source/drain trenches. Dielectric fill 119 may be any suitable dielectric material, such as silicon dioxide, silicon nitride, or silicon oxynitride.

According to some embodiments, the source and drain regions are epitaxial regions that are provided using an etch-and-replace process. In other embodiments one or both of the source and drain regions could be, for example, implantation-doped native portions of the semiconductor fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

According to some embodiments, a gate structure extends over nanoribbons 102 of the semiconductor devices along a second direction across the page of FIG. 1A. The second direction may be orthogonal to the first direction. The gate structure includes a gate dielectric 120 and a gate layer (or gate electrode) 122. Gate dielectric 120 represents any number of dielectric layers present between nanoribbons 102 and gate electrode 122. Gate dielectric 120 may also be present on the surfaces of other structures within the gate trench, such as on subregion 106 (or more specifically on dielectric liner 108 of subregion 106) and on dielectric layer 104. Gate dielectric 120 may include any suitable gate dielectric material(s). In some embodiments, gate dielectric 120 includes a layer of native oxide material (e.g., silicon dioxide) on the nanoribbons or other semiconductor regions making up the channel region of the devices, and a layer of high-K dielectric material (e.g., hafnium oxide) on the native oxide.

Gate electrode 122 may represent any number of conductive layers, such as any metal, metal alloy, or doped polysilicon layers. In some embodiments, gate electrode 122 includes one or more workfunction metals around nanoribbons 102. In some embodiments, the semiconductor devices are p-channel devices that include a workfunction metal having titanium around nanoribbons 102. In some embodiments, the semiconductor devices are an n-channel devices that include a workfunction metal having tungsten around nanoribbons 102. Gate electrode 122 may also include a fill metal or other conductive material (e.g., tungsten, ruthenium, molybdenum, copper, aluminum) around the workfunction metals to provide the whole gate electrode structure. In some embodiments, a gate cap 124 may be formed over gate electrode 122 to protect the underlying material during processing. Gate cap 124 may be any suitable dielectric material, such as silicon nitride.

In some embodiments, adjacent gate structures may be separated along the second direction (e.g., across the page) by a gate cut, which acts like a dielectric barrier or wall, or a power via which routes a power or ground rail between frontside and backside interconnect structures. In either case, the separated semiconductor devices along the second direction can be either n-channel or p-channel devices depending on the circuit configuration.

According to some embodiments, backside interconnect structures may be formed beneath subregions 106 and dielectric layer 104. The backside interconnect structures may include any number of dielectric layers and conductive structures (e.g., metal layers) within the dielectric layers. In the illustrated example, a first backside dielectric layer 126 includes one or more backside conductive structures 128 substantially coplanar with backside dielectric layer 126. Backside dielectric layer 126 may be any suitable dielectric material, such as silicon dioxide, silicon nitride, or silicon oxynitride. Backside dielectric layer 126 may be the same dielectric material as dielectric layer 104. Backside conductive structures 128 may include any suitable conductive material such as tungsten or molybdenum, and may provide power or ground rails for the integrated circuit.

Fabrication Methodology

FIGS. 2A-2I include cross-sectional views that collectively illustrate an example process for forming an integrated circuit with semiconductor devices having subfins replaced with one or more dielectric layers (e.g., a dielectric subregion), in accordance with an embodiment of the present disclosure. Each figure shows an example structure that results from the process flow up to that point in time, so the depicted structure evolves as the process flow continues, culminating in the structure shown in FIG. 2I, which is similar to the structure shown in FIG. 1A. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
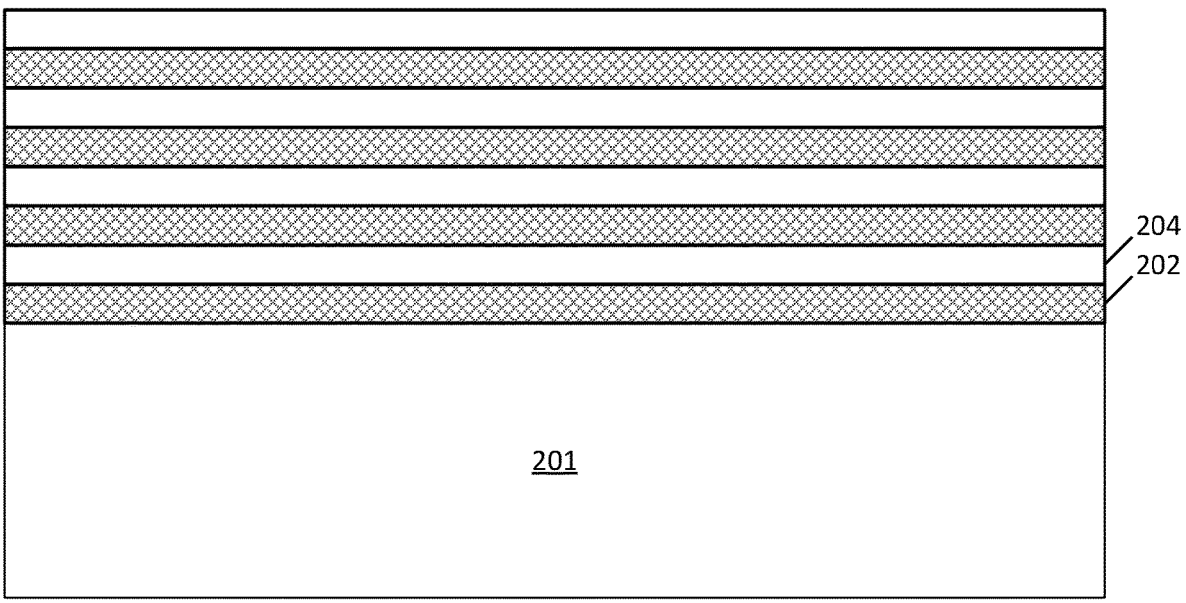
FIGS. 2A, 2B, 2C, 2D, 2E, 2F, 2G, 2H, and 2I are cross-sectional views that illustrate various stages in an example process for forming semiconductor devices with subfins replaced with one or more dielectric materials, in accordance with some embodiments of the present disclosure.

FIG. 2A illustrates a cross-sectional view taken through a substrate 201 having a series of material layers formed over the substrate, according to an embodiment of the present disclosure. Substrate 201 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 201 can be a semiconductor-on-insulator substrate having a desired semiconductor layer over a buried insulator layer (e.g., silicon over silicon dioxide). Alternatively, substrate 201 can be a multilayer substrate or superlattice suitable for forming nanowires or nanoribbons (e.g., alternating layers of silicon and SiGe, or alternating layers indium gallium arsenide and indium phosphide). Any number of substrates can be used.

Alternating material layers may be deposited over substrate 201 including sacrificial layers 202 alternating with semiconductor layers 204. The alternating layers are used to form GAA transistor structures. Any number of alternating semiconductor layers 204 and sacrificial layers 202 may be deposited over substrate 201. According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. In some examples, semiconductor layers 204 may be doped with either n-type dopants (to produce a p-channel transistor) or p-type dopants (to produce an n-channel transistor).

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm). The thickness of each of semiconductor layers 204 may be about the same as the thickness of each sacrificial layer 202 (e.g., about 5-20 nm). Each of sacrificial layers 202 and semiconductor layers 204 may be deposited using any known or proprietary material deposition technique, such as chemical vapor deposition (CVD), plasma-enhanced chemical vapor deposition (PECVD), physical vapor deposition (PVD), or atomic layer deposition (ALD).

Figure 2B:
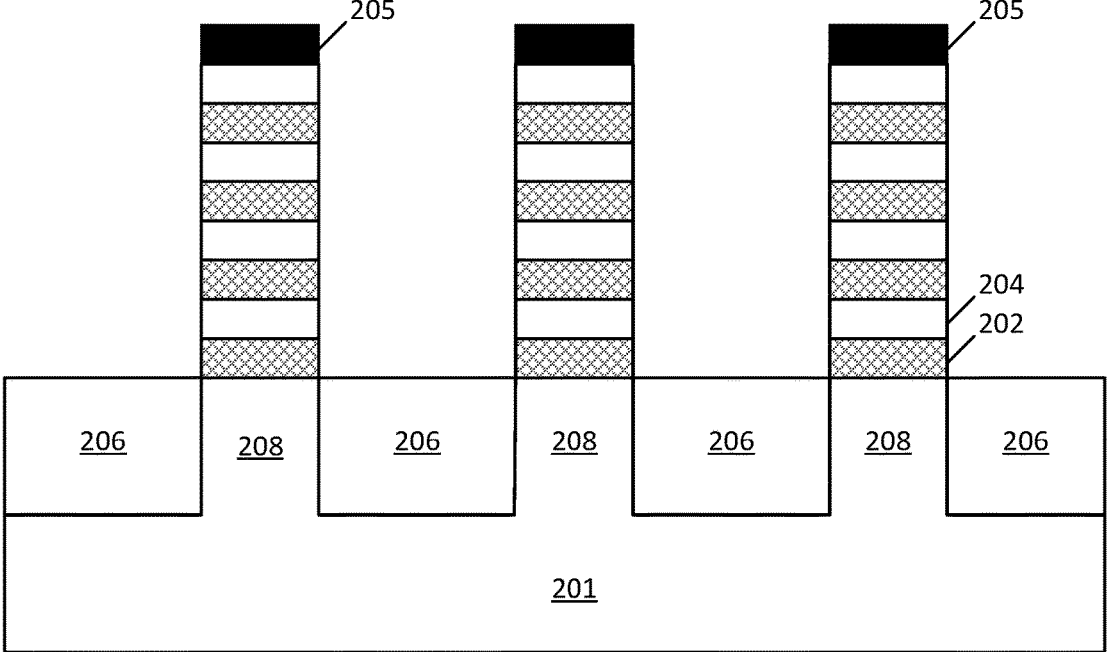

FIG. 2B depicts the cross-section view of the structure shown in FIG. 2A following the formation of a cap layer 205 and the subsequent formation of fins beneath cap layer 205, according to an embodiment. Cap layer 205 may be any suitable hard mask material such as a carbon hard mask (CHM) or silicon nitride. Cap layer 205 is patterned into rows to form corresponding rows of fins from the alternating layer stack of sacrificial layers 202 and semiconductor layers 204. The rows of fins extend lengthwise in a first direction (e.g., into and out of the page).

According to some embodiments, an anisotropic etching process through the layer stack continues into at least a portion of substrate 201. The etched portion of substrate 201 may be filled with a dielectric layer 206 that acts as shallow trench isolation (STI) between adjacent fins. Dielectric layer 206 may be any suitable dielectric material such as silicon dioxide. Subfins 208 represent remaining portions of substrate 201 between dielectric layer 206, according to some embodiments. Note how in this example the fins have relatively straight sidewalls from the top of a given fin to the bottom of the subfin 208. Other examples may have an outward taper such that the fins are narrower at the top than they are at the bottom, with subfin 208 being the widest portion of a given fin. The degree of taper may vary depending on factors such as the etch process used and the height-to-width aspect ratio of the fins being formed. Higher etch directionality tends to yield a lower degree of taper. In any such cases, whether tapered or not, note that co-linearity of the subfin 206 sidewalls with the upper fin sidewalls can be observed, given that the entire fin structure (upper fin and subfin 206) is etched with a common fin etch process. As described below, such co-linearity can be used to identify the subsequent removal of subfins 208, because a resulting recess that replaces a given subfin 208 effectively adopts the same sidewalls as that subfin 208 it replaced. There may be some etching of the laterally neighboring materials (e.g., such as dielectric 206), but such lateral movement of the sidewall is relatively small or otherwise negligible for purposes of assessing such co-linearity.

Figure 2C:
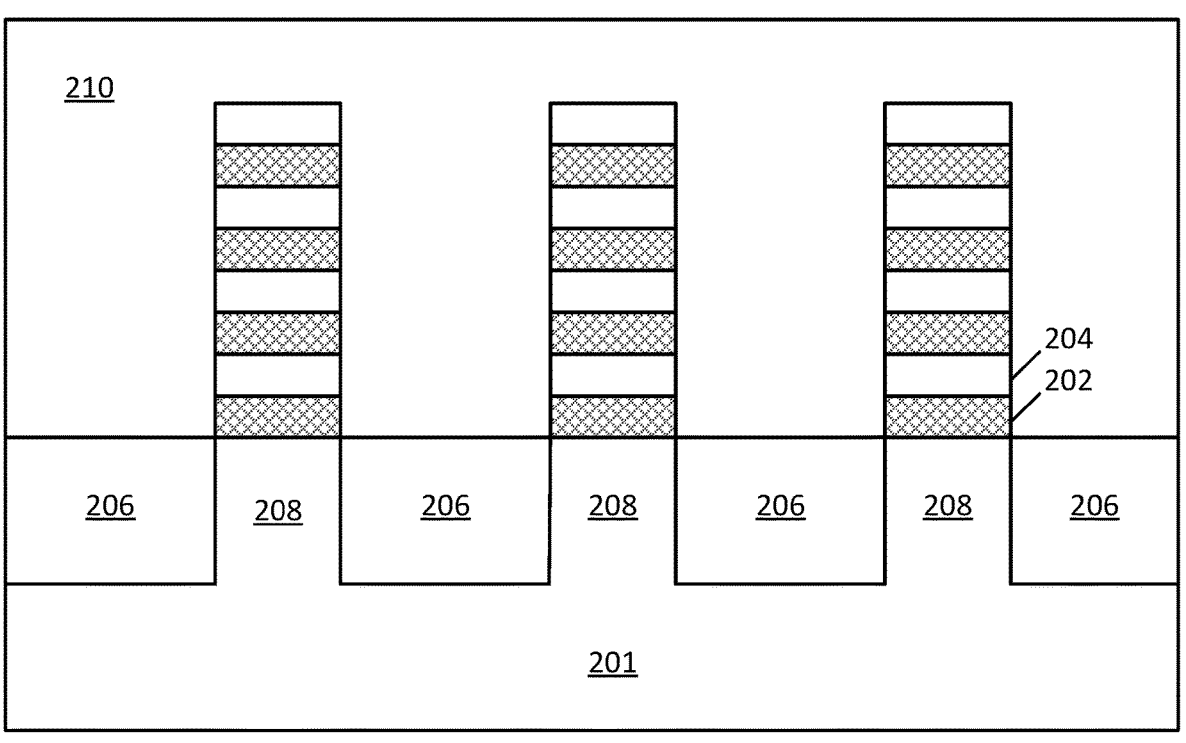

FIG. 2C depicts the cross-section view of the structure shown in FIG. 2B following the formation of a sacrificial gate 210 extending across the fins in a second direction different from the first direction, according to some embodiments. Sacrificial gate 210 may extend across the fins in a second direction that is orthogonal to the first direction. According to some embodiments, the sacrificial gate material is formed in parallel strips across the integrated circuit and removed in all areas not protected by a gate masking layer. Sacrificial gate 210 may be any suitable material that can be selectively removed without damaging the semiconductor material of the fins. In some examples, sacrificial gate 210 includes polysilicon.

Following the formation of sacrificial gate 210 (and prior to replacement of sacrificial gate 210 with a metal gate), additional semiconductor device structures are formed that are not shown in these cross-sections. These additional structures include spacer structures on the sidewalls of sacrificial gate 210 and source and drain regions on either ends of each of the fins. The formation of such structures can be accomplished using any number of processing techniques.

Figure 2D:
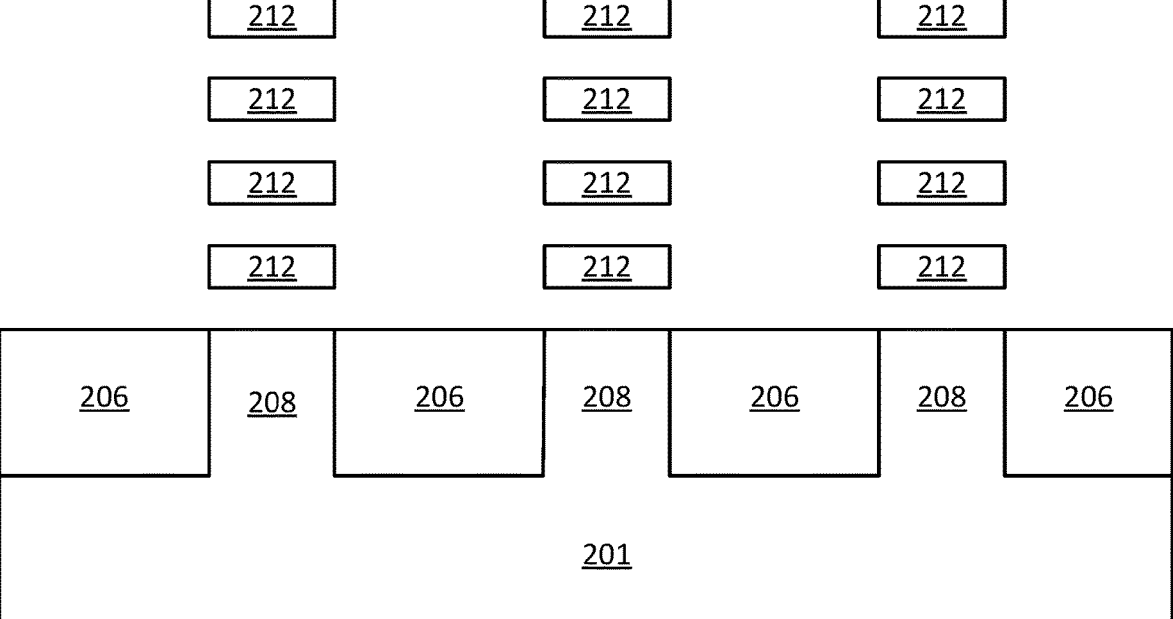

FIG. 2D depicts the cross-section view of the structure shown in FIG. 2C following the removal of sacrificial gate 210 and the removal of sacrificial layers 202, according to some embodiments. In examples where any gate masking layers are still present, they may also be removed at this time. Once sacrificial gate 210 is removed, the fins that had been beneath sacrificial gate 210 are exposed.

In the example where the fins include alternating semiconductor layers, sacrificial layers 202 are selectively removed to release nanoribbons 212 that extend between corresponding source or drain regions. Each vertical set of nanoribbons 212 represents the semiconductor or channel region of a different semiconductor device. It should be understood that nanoribbons 212 may also be nanowires or nanosheets (e.g., from a forksheet arrangement) or fins (e.g., for a finFET arrangement). Sacrificial gate 210 and sacrificial layers 202 may be removed using the same isotropic etching process or different isotropic etching processes.

Figure 2E:
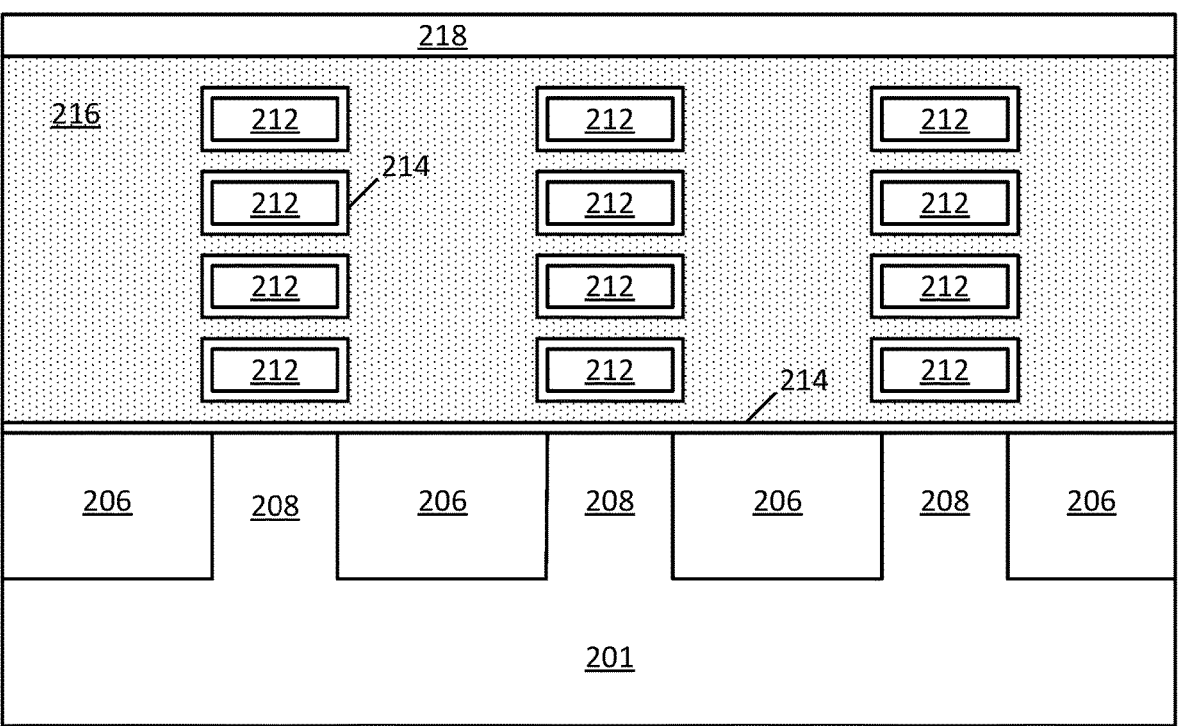

FIG. 2E depicts the cross-section view of the structure shown in FIG. 2D following the formation of a gate structure and subsequent polishing, according to some embodiments. The gate structure includes a gate dielectric 214 and a conductive gate electrode 216. Gate dielectric 214 may be first formed around nanoribbons 212 prior to the formation of gate electrode 216. The gate dielectric 214 may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 214 includes a layer of hafnium oxide with a thickness between about 1 nm and about 5 nm. In some embodiments, gate dielectric 214 may include one or more silicates (e.g., titanium silicate, tungsten silicate, niobium silicate, and silicates of other transition metals). In some cases, gate dielectric 214 may include a first layer on nanoribbons 212, and a second layer on the first layer. The first layer can be, for instance, an oxide of the semiconductor material of nanoribbons 212 (e.g., silicon dioxide) and the second layer can be a high-k dielectric material (e.g., hafnium oxide). More generally, gate dielectric 214 can include any number of dielectric layers. According to some embodiments, gate dielectric 214 forms along all surfaces exposed within the gate trench, such as along inner sidewalls of the spacer structures and along the top surfaces of dielectric layer 206 and subfins 208.

As noted above, gate electrode 216 can represent any number of conductive layers. The conductive gate electrode 216 may be deposited using electroplating, electroless plating, CVD, PECVD, ALD, or PVD, to name a few examples. In some embodiments, gate electrode 216 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate electrode 216 may include, for instance, a metal fill material along with one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates. Following the formation of the gate structure, the entire structure may be polished or planarized such that the top surface of the gate structure (e.g., top surface of gate electrode 216) is planar with the top surface of other semiconductor elements, such as the spacer structures that define the gate trench.

According to some embodiments, a gate cap 218 may be formed on the top surface of gate electrode 216. Gate cap 218 may be any suitable dielectric material, such as silicon nitride, silicon dioxide, or silicon oxynitride. In some examples, gate electrode 216 is recessed below a top surface of the adjacent spacer structures and gate cap 218 is formed within the recess and polished such that a top surface of gate cap 218 is substantially coplanar with a top surface of the adjacent spacer structures.

Figure 2F:
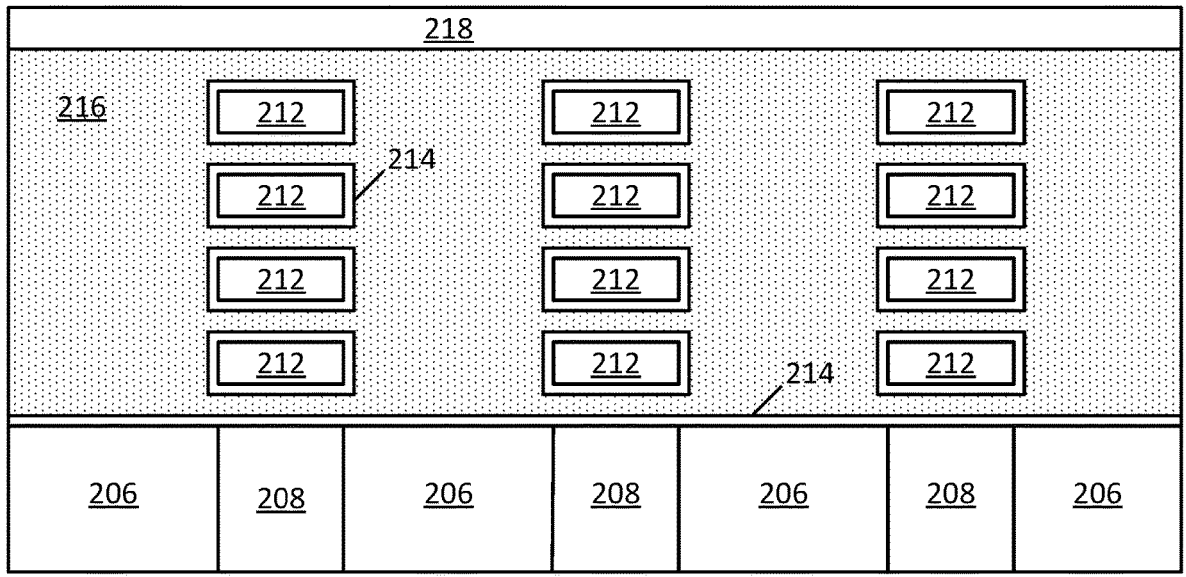

FIG. 2F illustrates another cross-section view of the structure shown in FIG. 2E following the removal of substrate 201 from the backside of the structure, according to some embodiments. Substrate 201 may be removed via any combination of grinding, polishing, and/or etching processes. In some embodiments, substrate 201 may continue to be thinned from the backside until bottom surfaces of dielectric layer 206 and/or subfins 208 adjacent to dielectric layer 206 are exposed. In some examples, the only portions of the semiconductor material from substrate 201 left behind following the backside removal process are subfins 208.

Figure 2G:
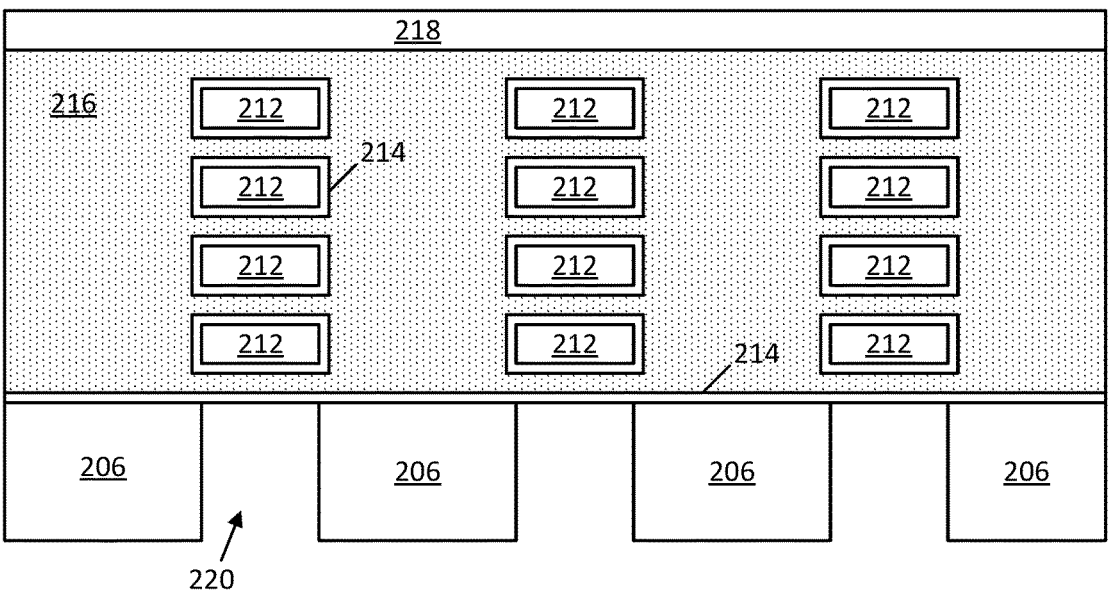

FIG. 2G illustrates another cross-section view of the structure shown in FIG. 2F following the removal of subfins 208 from the backside of the structure, thus leaving behind backside recesses 220, according to some embodiments. An isotropic etching process may be used to selectively remove the semiconductor material of subfins 208 while removing substantially little of the exposed dielectric materials, such as dielectric layer 206 and gate dielectric 214. In some examples, a dry silicon etching process can be used to selectively remove silicon subfins 208, with such etch being selective to dielectric layer 206 (e.g., silicon dioxide) and gate dielectric 214 (e.g., silicon dioxide and/or high-k dielectric materials such as hafnium oxide or aluminum oxide). In some such examples, the selective etch lands on the backside of the gate structure, such that the bottom of a given recess 220 is defined by the underside of gate dielectric 214 that is deposited within the gate trench during frontside gate processing. In such a case, the gate dielectric 214 may effectively act like an etch stop. Recesses 220 may extend along the first direction (e.g., into and out of the page) beneath nanoribbons 212.

Note how a given recess 220 effectively adopts the same sidewalls as the subfin 208 it replaced, given the etch selectivity. There may be some etching of the laterally neighboring dielectric 206, but such lateral movement of the sidewall is relatively small or otherwise negligible. The degree of such lateral movement may vary, depending on factors such as the duration of the recess etch and/or the selectivity of the etch process. In any such cases, co-linearity of a given recess 220 sidewalls with the upper fin sidewalls (in this example case, sidewalls of nanoribbons 212) may be observed. Such co-linearity is indicative of a subfin 208 removal process. It thus follows that any structure deposited into the recess may have its sidewalls be substantially co-linear with sidewalls of the above semiconductor channel region.

Figure 2H:
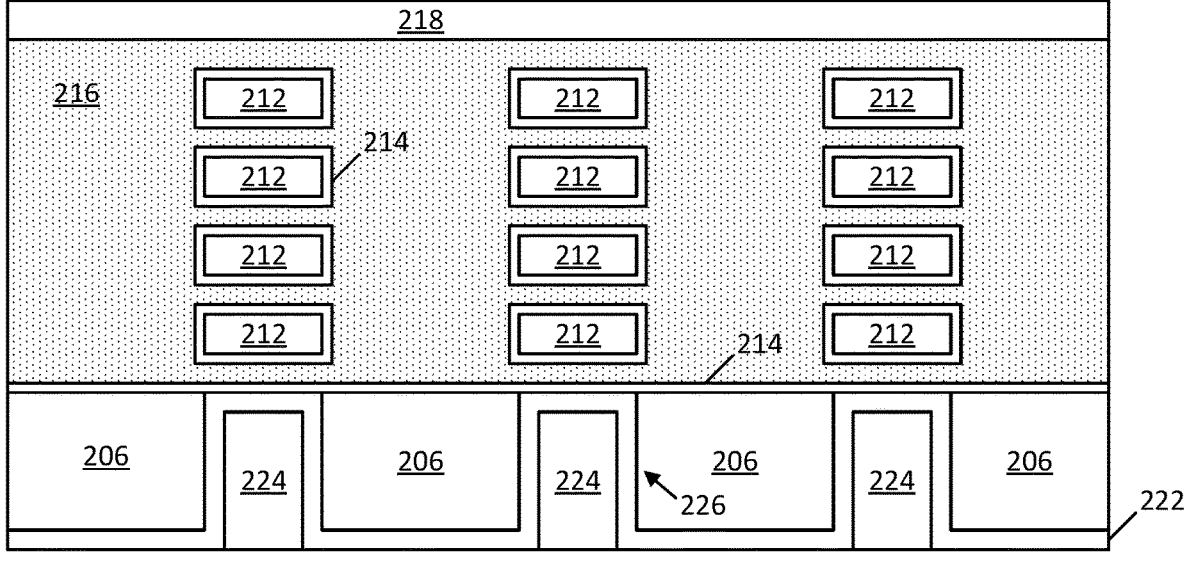

FIG. 2H illustrates another cross-section view of the structure shown in FIG. 2G following the formation of a dielectric liner 222 and a dielectric fill 224 within recesses 220, according to some embodiments. Dielectric subregions 226 may be formed by filling recesses 220 with the aforementioned dielectric materials. Accordingly, dielectric liner 222 may run along the edges of subregions 226 (and along sidewalls of dielectric layer 206 and beneath gate dielectric 214), while dielectric fill 224 constitutes the remaining portion of subregions 226.

According to some embodiments, dielectric liner 222 may be deposited first using any suitable deposition technique such as ALD, CVD, or PECVD. Dielectric liner 222 may be conformally deposited, for example, to a final thickness between about 1 nm and about 6 nm. Dielectric liner 222 may be any suitable dielectric material, such as silicon nitride, silicon carbide, silicon dioxide, or aluminum oxide, or silicon oxynitride. In some embodiments, dielectric liner 222 represents any number of deposited dielectric layers. For example, dielectric liner 222 may include a first layer of silicon dioxide and a second layer of silicon nitride or silicon carbide or silicon oxynitride or silicon oxycarbide or silicon oxycarbonitride. In another example, dielectric liner 222 includes a first layer of silicon carbide and a second layer of silicon nitride. In any case, dielectric liner 222 may be provided to protect any exposed portions of the source or drain regions and to protect the gate structure from subsequent oxidation procedures. In some embodiments, dielectric liner 222 imparts strain on the semiconductor devices, which can improve carrier mobility.

According to some embodiments, dielectric fill 224 may be deposited after the formation of dielectric liner 222. Dielectric fill 224 may be deposited using any suitable deposition technique, such as ALD, CVD, PECVD, spun-on dielectric, or flowable oxide. Dielectric fill 224 may substantially fill the remaining volume of subregions 226. Dielectric fill 224 may be any suitable dielectric material, such as silicon nitride, silicon carbide, silicon dioxide, aluminum oxide, or other such carbon-based or nitrogen-based or aluminum-based dielectric films. High-k dielectric materials other than aluminum oxide may be used as well, should the given application accommodate parasitic capacitance sometimes attributable to high-k materials. Following its formation, a bottom surface of dielectric fill 224 may be polished using a suitable technique such as chemical mechanical polishing (CMP).

Figure 2I:
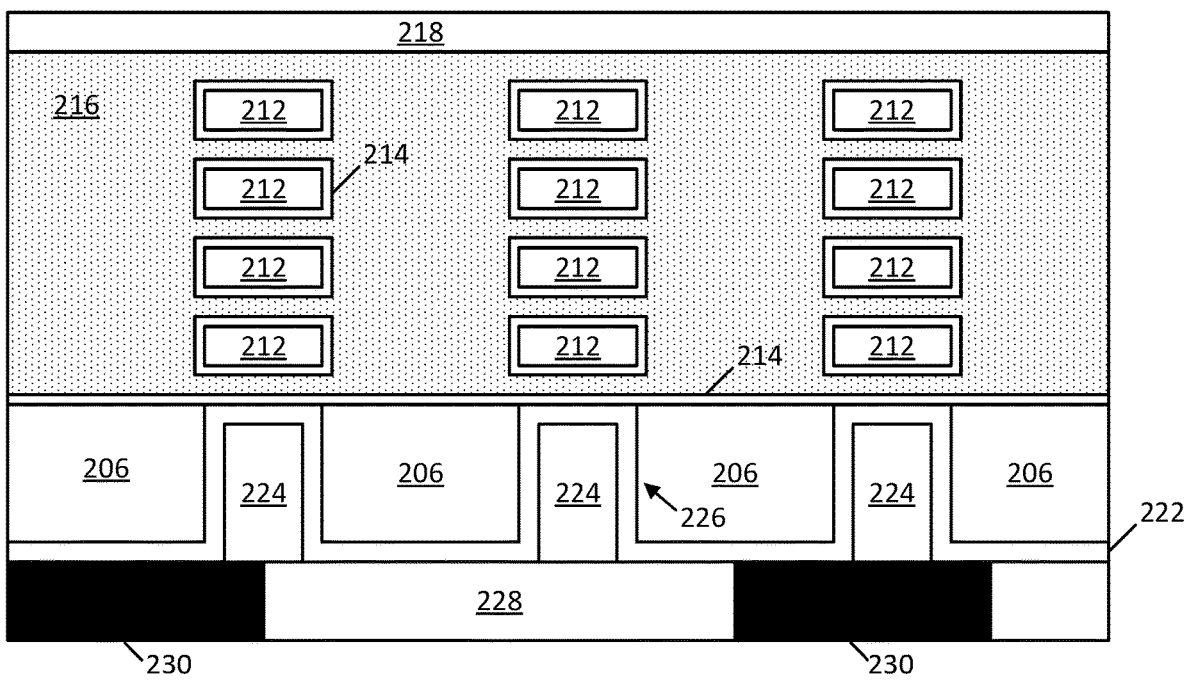
Figure 2I:
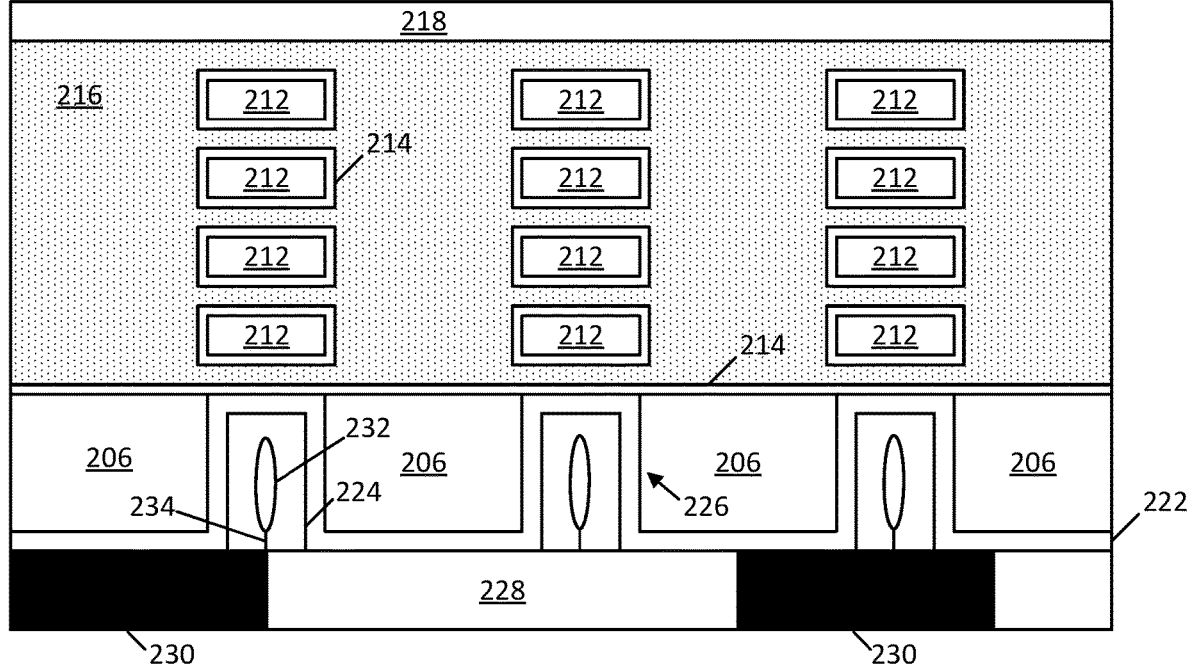

FIG. 2I illustrates another cross-section view of the structure shown in FIG. 2H following the formation of backside interconnect structures, according to some embodiments. The backside interconnect structures can include any number of dielectric layers and conductive features, such as vias or traces, to route power, ground, or logic signals to any of the semiconductor devices or to any frontside interconnect structures. In the illustrated example, a backside dielectric layer 228 and one or more conductive structures 230 may be formed within the same plane. Backside dielectric layer 228 can be any suitable dielectric material, such as silicon nitride, silicon dioxide, or silicon oxynitride. Conductive structures 230 may include any suitable conductive material, such as tungsten or molybdenum. In some embodiments, the conductive structures 230 may be formed directly on dielectric liner 222 and/or dielectric fill 224.

FIG. 2I' illustrates a cross-section view of the structure shown in FIG. 2I where subregions 226 include one or more airgaps 232, according to some embodiments. An airgap or void 232 may be formed during the deposition process of dielectric fill 224. For example, a physical vapor deposition (PVD) process, such as sputtering, may be performed to cause the dielectric material to pinch together at the opening of the recess before the recess is fully filled (sometimes referred to as pinch-off). The result may include a seam 234 near the opening of the recess where dielectric fill 224 comes together and an airgap 232 leading away from seam 234. Any size airgap 232 may be formed depending on the deposition process. Note that the use of the term airgap is not intended to limit the gap to being filled with air; rather, the airgap may be filled with any one or more process gasses (e.g., oxygen, nitrogen, air, or some other gas), or devoid of any gas. The resulting airgap or void 232 is unfilled with solid material.

Figure 3:
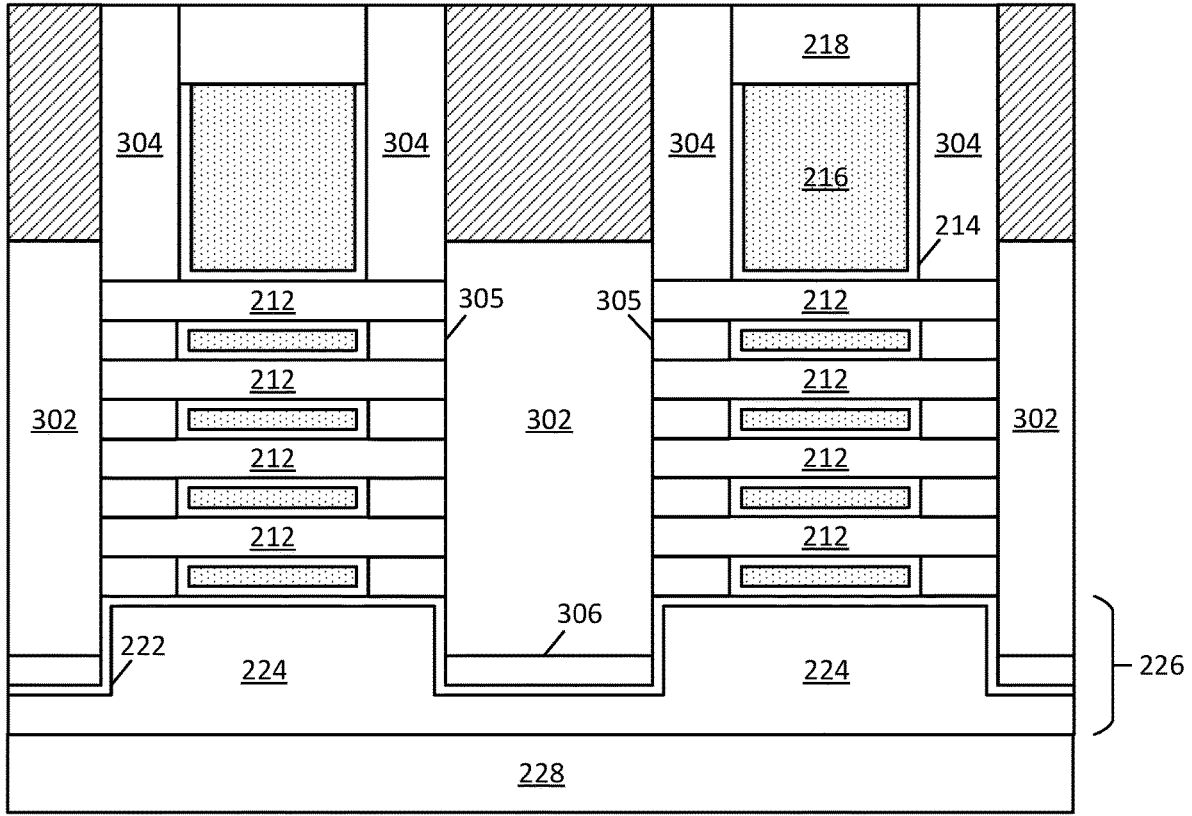
FIG. 3 illustrates another cross-sectional view of the semiconductor devices from FIG. 2I with subfins replaced with one or more dielectric materials, in accordance with some embodiments of the present disclosure.

FIG. 3 illustrates another cross-section view of the structure shown in FIG. 2I along an orthogonal plane to the cross-section views of FIGS. 2A-2I. The cross-section view of FIG. 3 is taken along the length of several semiconductor devices over a common subregion 226. Source or drain regions 302 between adjacent devices and grown from the ends of nanoribbons 212 extend into at least a portion of subregion 226 within source/drain trenches between spacer structures 304 and inner spacers 305. As discussed above, spacer structures and inner spacers may be any suitable dielectric material, such as silicon nitride, silicon dioxide, or silicon oxynitride. A bottom dielectric layer 306 may be formed at the bottom portion of the source/drain trenches below source or drain regions 302, although other examples may not include bottom dielectric layer 306.

Since source or drain regions 302 may extend into a portion of the underlying subfin, a parasitic junction can be formed between the bottoms of the source or drain regions 302 and the subfin. However, according to some embodiments, the subfin has been replaced with subregion 226 having dielectric liner 222 and dielectric fill 224 to prevent the formation of the parasitic junction and also reduce parasitic capacitance. Note that the depth to which source or drain regions 302 and bottom dielectric layer 306 extend into subregion 226 may vary. In some embodiments, source or drain regions 302 and bottom dielectric layer 306 together extend through an entire thickness of subregion 226. In still other embodiments, source or drain regions 302 and bottom dielectric layer 306 do not extend into a thickness of subregion 226, such that an upper surface of subregion 226 is relatively flat, rather than corrugated as shown. In some embodiments, bottom dielectric layer 306 may have a total thickness that is close to the total thickness of subregion 226, such as more than 95%, 90%, 85%, 80%, 75%, 70%, 65%, 60%, 55%, or 50% the total thickness of subregion 226. Although the illustration shows source or drain regions 302 with straight sidewalls that extend into subregion 226, in practice these sidewalls may exhibit tapering due to backside etching and other fabrication effects.

Note in the illustrated example how a portion of subregion 226 extends upward under the gate structure to meet a bottom side of the gate trench upon which gate dielectric 214 and spacer 305 were previously deposited. When etching the recess for subregion 226 (such as described with reference to FIG. 2G), further note that the recess etch may be selective to the source or drain regions 302 and bottom dielectric layer 306, so as to not greatly impact those regions. However, some etching of the source or drain regions 302 and dielectric layer 306 may be tolerated, particularly when those regions that are etched extend below the gate structure as they do in this example. In such cases, that bottom portion of source or drain regions 302 as well as dielectric layer 306 may taper inward as a result of the recess etch process. In some such examples, liner 222 conforms to the resulting topology of that exposed and etched portion of the source or drain regions 302 and dielectric layer 306.

Figure 4:
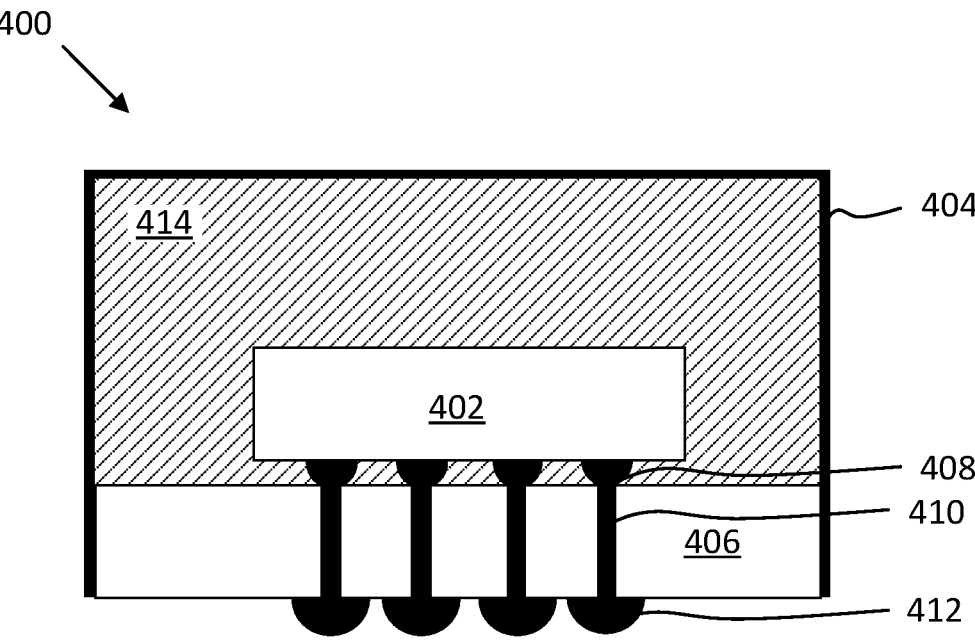
FIG. 4 illustrates a cross-sectional view of a chip package containing one or more semiconductor dies, in accordance with some embodiments of the present disclosure.

FIG. 4 illustrates an example embodiment of a chip package 400, in accordance with an embodiment of the present disclosure. As can be seen, chip package 400 includes one or more dies 402. One or more dies 402 may include at least one integrated circuit having semiconductor devices, such as any of the semiconductor devices disclosed herein. One or more dies 402 may include any other circuitry used to interface with other devices formed on the dies, or other devices connected to chip package 400, in some example configurations.

As can be further seen, chip package 400 includes a housing 404 that is bonded to a package substrate 406. The housing 404 may be any standard or proprietary housing, and may provide, for example, electromagnetic shielding and environmental protection for the components of chip package 400. The one or more dies 402 may be conductively coupled to a package substrate 406 using connections 408, which may be implemented with any number of standard or proprietary connection mechanisms, such as solder bumps, ball grid array (BGA), pins, or wire bonds, to name a few examples. Package substrate 406 may be any standard or proprietary package substrate, but in some cases includes a dielectric material having conductive pathways (e.g., including conductive vias and lines) extending through the dielectric material between the faces of package substrate 406, or between different locations on each face. In some embodiments, package substrate 406 may have a thickness less than 1 millimeter (e.g., between 0.1 millimeters and 0.5 millimeters), although any number of package geometries can be used. Additional conductive contacts 412 may be disposed at an opposite face of package substrate 406 for conductively contacting, for instance, a printed circuit board (PCB). One or more vias 410 extend through a thickness of package substrate 406 to provide conductive pathways between one or more of connections 408 to one or more of contacts 412. Vias 410 are illustrated as single straight columns through package substrate 406 for ease of illustration, although other configurations can be used (e.g., damascene, dual damascene, through-silicon via, or an interconnect structure that meanders through the thickness of substrate 406 to contact one or more intermediate locations therein). In still other embodiments, vias 410 are fabricated by multiple smaller stacked vias, or are staggered at different locations across package substrate 406. In the illustrated embodiment, contacts 412 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 412, to inhibit shorting.

In some embodiments, a mold material 414 may be disposed around the one or more dies 402 included within housing 404 (e.g., between dies 402 and package substrate 406 as an underfill material, as well as between dies 402 and housing 404 as an overfill material). Although the dimensions and qualities of the mold material 414 can vary from one embodiment to the next, in some embodiments, a thickness of mold material 414 is less than 1 millimeter. Example materials that may be used for mold material 414 include epoxy mold materials, as suitable. In some cases, the mold material 414 is thermally conductive, in addition to being electrically insulating.

Methodology

FIG. 5 is a flow chart of a method 500 for forming at least a portion of an integrated circuit, according to an embodiment. Various operations of method 500 may be illustrated in FIGS. 2A-2I. However, the correlation of the various operations of method 500 to the specific components illustrated in the aforementioned figures is not intended to imply any structural and/or use limitations. Rather, the aforementioned figures provide one example embodiment of method 500. Other operations may be performed before, during, or after any of the operations of method 500. For example, method 500 does not explicitly describe all processes that are performed to form common transistor structures. Some of the operations of method 500 may be performed in a different order than the illustrated order.

Method 500 begins with operation 502 where any number of parallel semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. The alternating layers can be blanket deposited and then etched into fins or deposited into fin-shaped trenches. The fins may also include a cap structure over each fin that is used to define the locations of the fins during, for example, an RIE process. The cap structure may be a dielectric material, such as silicon nitride.

According to some embodiments, a dielectric layer is formed around subfin portions of the one or more fins. In some embodiments, the dielectric layer extends between each pair of adjacent parallel fins and runs lengthwise in the same direction as the fins. In some embodiments, the anisotropic etching process that forms the fins also etches into a portion of the substrate and the dielectric layer may be formed within the recessed portions of the substrate. Accordingly, the dielectric layer acts as shallow trench isolation (STI) between adjacent fins. The dielectric layer may be any suitable dielectric material, such as silicon dioxide. Lower portions of the fins adjacent to the dielectric layer may be identified as the subfins.

Method 500 continues with operation 504 where a sacrificial gate and spacer structures are formed over the fins. The sacrificial gate may be patterned using a gate masking layer in a strip that runs orthogonally over the fins (many gate masking layers and corresponding sacrificial gates may be formed parallel to one another (e.g., forming a cross-hatch pattern with the fins). The gate masking layer may be any suitable hard mask material, such as CHM or silicon nitride. The sacrificial gate may be formed from any suitable material that can be selectively removed at a later time without damaging the semiconductor material of the fins. In one example, the sacrificial gate includes polysilicon. The spacer structures may be deposited and then etched back such that the spacer structures remain mostly only on sidewalls of any exposed structures. According to some embodiments, the spacer structures may be any suitable dielectric material, such as silicon nitride or silicon oxynitride.

Method 500 continues with operation 506 where source or drain regions are formed at the ends of the semiconductor regions of each of the fins. Any portions of the fins not protected by the sacrificial gate and spacer structures may be removed using, for example, an anisotropic etching process followed by the epitaxial growth of the source or drain regions from the exposed ends of the semiconductor layers in the fins. In some example embodiments, the source or drain regions are NMOS source or drain regions (e.g., epitaxial silicon) or PMOS source or drain regions (e.g., epitaxial SiGe). Another dielectric fill may be formed adjacent to the various source or drain regions for additional electrical isolation between adjacent regions. The dielectric fill may also extend over a top surface of the source or drain regions. In some embodiments, topside conductive contacts may be formed through the dielectric fill to contact one or more of the source or drain regions.

Method 500 continues with operation 508 where the sacrificial gate is removed and replaced with a gate structure. The sacrificial gate may be removed using an isotropic etching process that selectively removes all of the material from the sacrificial gate, thus exposing the various fins between the set of spacer structures. In the example case where GAA transistors are used, any sacrificial layers within the exposed fins between the spacer structures may also be removed to release nanoribbons, nanosheets, or nanowires of semiconductor material.

The gate structure may include both a gate dielectric and a gate electrode. The gate dielectric is first formed over the exposed semiconductor regions between the spacer structures followed by forming the gate electrode within the remainder of the trench between the spacer structures, according to some embodiments. The gate dielectric may include any number of dielectric layers deposited using a CVD process, such as ALD. The gate electrode can include any number of conductive material layers, such as any metals, metal alloys, or polysilicon. The gate electrode may be deposited using electroplating, electroless plating, CVD, ALD, PECVD, or PVD, to name a few examples. In some embodiments, the gate electrode may be recessed, and a dielectric gate cap is formed within the recessed area.

Method 500 continues with operation 510 where the substrate is removed from the backside of the structure. The substrate may be removed via any combination of grinding, polishing, and/or etching processes. In some embodiments, the substrate is thinned away at least up until bottom surfaces of the dielectric layer and/or subfins adjacent to the dielectric layer are exposed. In some examples, the only portions of the semiconductor material from the substrate left behind following the backside removal process are the subfins.

Method 500 continues with operation 512 where the semiconductor subfins are removed from the backside of the structure between the dielectric layer. Any suitable isotropic etching process may be used to selectively remove the semiconductor material of the subfins while removing substantially little of the exposed dielectric materials, such as the dielectric layer and the gate dielectric. In some examples, a dry silicon etching process (e.g., using fluorine-based gases) can remove silicon subfins. The removal of the subfins leaves behind subfin recesses between the dielectric layer on the backside of the structure.

Method 500 continues with operation 514 where a dielectric liner is formed within the subfin recesses. The dielectric liner may be deposited to a final thickness between about 1 nm and about 6 nm using any suitable conformal deposition technique such as ALD, CVD, or PECVD. The dielectric liner may be any suitable dielectric material, such as silicon nitride, silicon carbide, silicon dioxide, or silicon oxynitride, and may include any number of different dielectric layers. In any configuration, the dielectric liner may be provided to protect any exposed portions of the source or drain regions and to protect the gate structure from subsequent oxidation procedures.

Method 500 continues with operation 516 where a dielectric fill is formed within a remaining volume of the subfin recesses. The dielectric fill may be formed using any suitable deposition technique, such as ALD, CVD, PECVD, spun-on dielectric, or flowable oxide. In some examples, dielectric fill 224 is formed using any form of physical vapor deposition to leave an airgap within a central portion of the subfin recesses. The dielectric fill may be any suitable dielectric material, such as silicon nitride, silicon carbide, silicon dioxide, aluminum oxide, or carbon-based films. Following its formation, a bottom surface of the dielectric fill may be polished using a suitable technique such as CMP.

Example System

Figure 6:
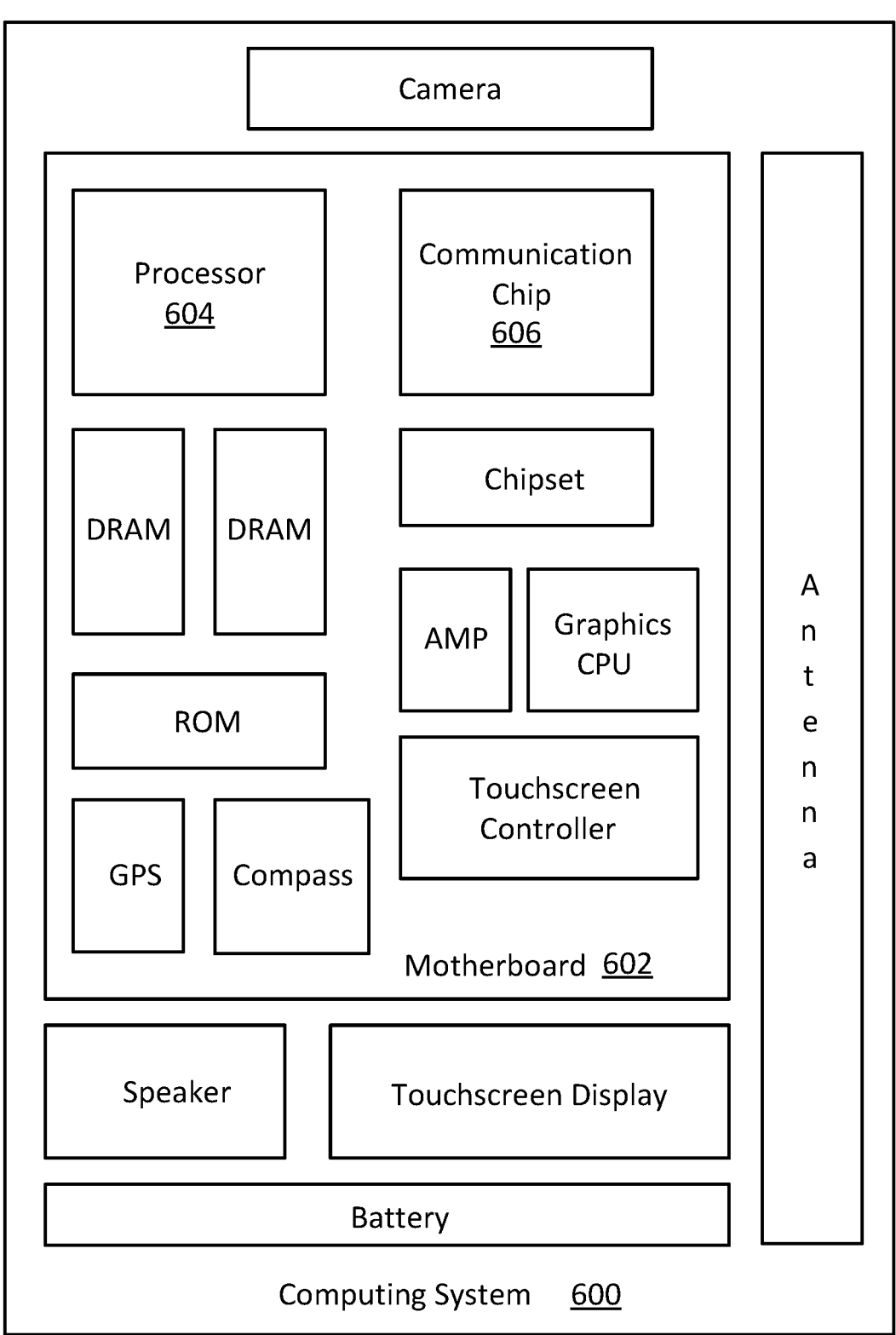
FIG. 6 illustrates a computing system including one or more integrated circuits, as variously described herein, in accordance with an embodiment of the present disclosure.

FIG. 6 is an example computing system implemented with one or more of the integrated circuit structures as disclosed herein, in accordance with some embodiments of the present disclosure. As can be seen, the computing system 600 houses a motherboard 602. The motherboard 602 may include a number of components, including, but not limited to, a processor 604 and at least one communication chip 606, each of which can be physically and electrically coupled to the motherboard 602, or otherwise integrated therein. As will be appreciated, the motherboard 602 may be, for example, any printed circuit board (PCB), whether a main board, a daughterboard mounted on a main board, or the only board of system 600, etc.

Depending on its applications, computing system 600 may include one or more other components that may or may not be physically and electrically coupled to the motherboard 602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with an example embodiment, such as a module including an integrated circuit on a substrate, the substrate having semiconductor devices that have their subfins replaced with one or more dielectric materials. In some embodiments, multiple functions can be integrated into one or more chips (e.g., for instance, note that the communication chip 606 can be part of or otherwise integrated into the processor 604).

The communication chip 606 enables wireless communications for the transfer of data to and from the computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing system 600 includes an integrated circuit die packaged within the processor 604. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 606 also may include an integrated circuit die packaged within the communication chip 606. In accordance with some such example embodiments, the integrated circuit die of the communication chip includes one or more semiconductor devices as variously described herein. As will be appreciated in light of this disclosure, note that multi-standard wireless capability may be integrated directly into the processor 604 (e.g., where functionality of any chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, the computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 600 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a semiconductor region extending from a source or drain region in a first direction, a gate structure extending over the semiconductor region in a second direction different from the first direction, a dielectric layer beneath the gate structure, and a subregion directly beneath the semiconductor region and adjacent to the dielectric layer. The subregion includes a dielectric liner along edges of the subregion and a dielectric fill within at least a portion of a remaining volume of the subregion, such that the dielectric liner is between the dielectric layer and the dielectric fill.

Example 2 includes the integrated circuit of Example 1, further comprising one or more conductive layers on a bottom surface of the dielectric layer, such that the dielectric layer is between the one or more conductive layers and the gate structure.

Example 3 includes the integrated circuit of Example 2, wherein a portion of the one or more conductive layers is on a portion of the dielectric fill.

Example 4 includes the integrated circuit of any one of Examples 1-3, wherein the subregion abuts a bottom surface of the gate structure.

Example 5 includes the integrated circuit of any one of Examples 1-4, wherein the gate structure comprises a gate electrode and a gate dielectric, and wherein the gate dielectric is on the subregion.

Example 6 includes the integrated circuit of Example 5, wherein the gate dielectric comprises hafnium and oxygen Example 7 includes the integrated circuit of any one of Examples 1-6, wherein the dielectric layer comprises silicon and oxygen.

Example 8 includes the integrated circuit of any one of Examples 1-7, wherein the dielectric liner has a thickness between about 1 nm and about 6 nm.

Example 9 includes the integrated circuit of any one of Examples 1-8, wherein the dielectric liner comprises silicon and any one of nitrogen, carbon, or oxygen.

Example 10 includes the integrated circuit of any one of Examples 1-8, wherein the dielectric liner comprises aluminum and oxygen.

Example 11 includes the integrated circuit of any one of Examples 1-10, wherein the dielectric fill comprises silicon and any one of nitrogen, carbon, or oxygen.

Example 12 includes the integrated circuit of any one of Examples 1-10, wherein the dielectric fill comprises aluminum and oxygen.

Example 13 includes the integrated circuit of any one of Examples 1-12, wherein at least a portion of the remaining volume of the subregion comprises an airgap.

Example 14 includes the integrated circuit of any one of Examples 1-13, wherein the semiconductor region comprises one or more semiconductor nanoribbons.

Example 15 includes the integrated circuit of Example 14, wherein the one or more semiconductor nanoribbons comprises germanium, silicon, or any combination thereof.

Example 16 is a printed circuit board comprising the integrated circuit of any one of Examples 1-15.

Example 17 is an electronic device that includes a chip package having one or more dies. At least one of the one or more dies includes a semiconductor device having a semiconductor region extending in a first direction from a source or drain region and a gate structure extending over the semiconductor region in a second direction different from the first direction, a dielectric layer beneath the gate structure, and a subregion directly beneath the semiconductor region and adjacent to the dielectric layer. The subregion includes a dielectric liner along edges of the subregion, and a dielectric fill within at least a portion of a remaining volume of the subregion, such that the dielectric liner is between the dielectric layer and the dielectric fill.

Example 18 includes the electronic device of Example 17, wherein the at least one of the one or more dies further comprises one or more conductive layers on a bottom surface of the dielectric layer, such that the dielectric layer is between the one or more conductive layers and the gate structure.

Example 19 includes the electronic device of Example 17 or 18, wherein the gate structure comprises a gate electrode and a gate dielectric, and wherein the gate dielectric is on the subregion.

Example 20 includes the electronic device of Example 19, wherein the gate dielectric comprises hafnium and oxygen.

Example 21 includes the electronic device of any one of Examples 17-20, wherein the dielectric layer comprises silicon and oxygen.

Example 22 includes the electronic device of any one of Examples 17-21, wherein the dielectric liner has a thickness between about 1 nm and about 6 nm.

Example 23 includes the electronic device of any one of Examples 17-22, wherein the dielectric liner comprises silicon and any one of nitrogen, carbon, or oxygen.

Example 24 includes the electronic device of any one of Examples 17-22, wherein the dielectric liner comprises aluminum and oxygen.

Example 25 includes the electronic device of any one of Examples 17-24, wherein the dielectric fill comprises silicon and any one of nitrogen, carbon, or oxygen.

Example 26 includes the electronic device of any one of Examples 17-24, wherein the dielectric fill comprises aluminum and oxygen.

Example 27 includes the electronic device of any one of Examples 17-26, wherein at least a portion of the remaining volume of the subregion comprises an airgap.

Example 28 includes the electronic device of any one of Examples 17-27, wherein the semiconductor region comprises one or more semiconductor nanoribbons.

Example 29 includes the electronic device of Example 28, wherein the one or more semiconductor nanoribbons comprises germanium, silicon, or any combination thereof.

Example 30 includes the electronic device of any one of Examples 17-29, further comprising a printed circuit board, wherein the chip package is attached to the printed circuit board.

Example 31 is a method of forming an integrated circuit. The method includes forming a multilayer fin extending in a first direction over a substrate having a first section with first material layers alternating with second material layers, and a subfin beneath the first section; forming a dielectric layer adjacent to the subfin; forming a sacrificial gate and spacers on sidewalls of the sacrificial gate, the sacrificial gate extending in a second direction over the multilayer fin, the second direction being different from the first direction; removing an exposed portion of the multilayer fin adjacent to the sacrificial gate to form a first recess through the multilayer fin; forming a source or drain region from ends of the second material layers and within the first recess; replacing the sacrificial gate with a gate structure; removing a portion of the substrate from a backside of the integrated circuit to expose a bottom surface of the subfin; removing the subfin from the backside to form a second recess through the dielectric layer; forming a dielectric liner along one or more edges of the second recess; and depositing a dielectric fill within at least a portion of a remaining volume of the recess.

Example 32 includes the method of Example 31, wherein the first material layers comprise silicon and germanium and the second material layers comprise silicon.

Example 33 includes the method of Example 31 or 32, further comprising forming one or more backside conductive traces on a bottom surface of the dielectric layer.

Example 34 includes the method of any one of Examples 31-33, wherein forming the dielectric fill comprises leaving an airgap within at least a portion of the remaining volume of the recess.

Example 35 is an integrated circuit that includes a subregion of a semiconductor device. The subregion is beneath a semiconductor region and adjacent to a dielectric layer. The integrated circuit also includes a gate structure over the semiconductor region such that both the subregion and the dielectric layer are beneath the gate structure. The subregion includes a dielectric liner along edges of the subregion and a dielectric fill within at least a portion of a remaining volume of the subregion. The dielectric liner is between the dielectric layer and the dielectric fill.

Example 36 includes the integrated circuit of Example 35, further comprising one or more conductive layers on a bottom surface of the dielectric layer, such that the dielectric layer is between the one or more conductive layers and the gate structure.

Example 37 includes the integrated circuit of Example 36, wherein a portion of the one or more conductive layers is on a portion of the dielectric fill.

Example 38 includes the integrated circuit of any one of Examples 35-37, wherein the gate structure comprises a gate electrode and a gate dielectric, and wherein the gate dielectric is on the subregion.

Example 39 includes the integrated circuit of Example 38, wherein the gate dielectric comprises hafnium and oxygen.

Example 40 includes the integrated circuit of any one of Examples 35-39, wherein the dielectric layer comprises silicon and oxygen.

Example 41 includes the integrated circuit of any one of Examples 35-40, wherein the dielectric liner has a thickness between about 1 nm and about 6 nm.

Example 42 includes the integrated circuit of any one of Examples 35-41, wherein the dielectric liner comprises silicon and any one of nitrogen, carbon, or oxygen.

Example 43 includes the integrated circuit of any one of Examples 35-41, wherein the dielectric liner comprises aluminum and oxygen.

Example 44 includes the integrated circuit of any one of Examples 35-43, wherein the dielectric fill comprises silicon and any one of nitrogen, carbon, or oxygen.

Example 45 includes the integrated circuit of any one of Examples 35-43, wherein the dielectric fill comprises aluminum and oxygen.

Example 46 includes the integrated circuit of any one of Examples 35-45, wherein at least a portion of the remaining volume of the subregion comprises an airgap.

Example 47 includes the integrated circuit of any one of Examples 35-46, wherein the semiconductor region comprises one or more semiconductor nanoribbons.

Example 48 includes the integrated circuit of Example 47, wherein the one or more semiconductor nanoribbons comprises germanium, silicon, or any combination thereof.

Example 49 is a printed circuit board comprising the integrated circuit of any one of Examples 35-48.

Example 50 is an integrated circuit that includes a gate trench having a bottom surface, a nanowire or nanoribbon within the gate trench and above the bottom surface, a gate dielectric wrapped around the nanowire or nanoribbon. The gate dielectric is on the bottom surface of the gate trench. The integrated circuit also includes a gate electrode within the gate trench and on the gate dielectric and a layer of dielectric material below the gate dielectric that is on the bottom surface of the gate trench. The layer of dielectric material has a recess therein that lands on a backside of the gate dielectric that is on the bottom surface of the gate trench. The integrated circuit also includes a dielectric liner within the recess, and a dielectric fill within at least a portion of a remaining volume of the recess, such that the dielectric liner is between the layer of dielectric material and the dielectric fill.

Example 51 includes the integrated circuit of Example 50, wherein sidewalls of the recess within the layer of dielectric material are co-linear with sidewalls of the nanowire or nanoribbon.

Example 52 includes the integrated circuit of Example 50 or 51, wherein the gate electrode comprises a fill metal and/or a workfunction material.

Example 53 includes the integrated circuit of any one of Examples 50-52, wherein the gate dielectric comprises a first layer and a second layer that is on the first layer, the second layer including a high-k dielectric material.

Example 54 includes the integrated circuit of Example 53, wherein the recess lands on the first layer.

Example 55 includes the integrated circuit of any one of Examples 50-54, wherein the remaining volume of the recess includes a volume that is devoid of solid material.

Example 56 includes the integrated circuit of any one of Examples 50-55, further comprising a source or drain region, wherein the nanowire or nanoribbon extends from the source or drain region.

Example 57 includes the integrated circuit of Example 56, wherein a bottom portion of the source or drain region is laterally between portions of the dielectric liner.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
   a semiconductor region extending from a source or drain region;
   a gate structure extending over the semiconductor region;
   a dielectric layer beneath the gate structure; and
   a subregion beneath the semiconductor region and laterally adjacent to the dielectric layer, wherein the subregion comprises
   a dielectric liner along edges of the subregion and along a bottom surface of the dielectric layer, and
   a dielectric fill within at least a portion of a remaining volume of the subregion, such that the dielectric liner is between the dielectric layer and the dielectric fill.

2. The integrated circuit of claim 1, further comprising one or more conductive layers on a bottom surface of the dielectric liner, such that the dielectric liner is between the one or more conductive layers and the gate structure.

3. The integrated circuit of claim 2, wherein a portion of the one or more conductive layers is on a portion of the dielectric fill.

4. The integrated circuit of claim 1, wherein the subregion abuts a bottom surface of the gate structure.

5. The integrated circuit of claim 1, wherein the dielectric liner has a thickness between about 1 nm and about 6 nm.

6. The integrated circuit of claim 1, wherein at least a portion of the remaining volume of the subregion comprises an airgap.

7. A printed circuit board comprising the integrated circuit of claim 1.

8. An integrated circuit comprising:

a subregion of a semiconductor device, the subregion being beneath a semiconductor region and laterally adjacent to a dielectric layer; and a gate structure over the semiconductor region such that both the subregion and the dielectric layer are beneath the gate structure;

wherein the subregion comprises a dielectric liner along edges of the subregion and along a bottom surface of the dielectric layer, and a dielectric fill within at least a portion of a remaining volume of the subregion, such that the dielectric liner is between the dielectric layer and the dielectric fill.

9. The integrated circuit of claim 8, further comprising one or more conductive layers on a bottom surface of the dielectric liner, such that the dielectric liner is between the one or more conductive layers and the gate structure.

10. The integrated circuit of claim 9, wherein a portion of the one or more conductive layers is on a portion of the dielectric fill.

11. The integrated circuit of claim 8, wherein the gate structure comprises a gate electrode and a gate dielectric, and wherein the gate dielectric is on the subregion.

12. The integrated circuit of claim 11, wherein the gate dielectric comprises hafnium and oxygen.

13. The integrated circuit of claim 8, wherein the dielectric liner has a thickness between about 1 nm and about 6 nm.

14. The integrated circuit of claim 8, wherein the dielectric liner comprises silicon and any one of nitrogen, carbon, or oxygen.

15. An integrated circuit comprising:

a gate trench having a bottom surface;

a nanowire or nanoribbon within the gate trench and above the bottom surface;

a gate dielectric wrapped around the nanowire or nanoribbon, the gate dielectric also on the bottom surface of the gate trench;

a gate electrode within the gate trench and on the gate dielectric;

a layer of dielectric material below the gate dielectric that is on the bottom surface of the gate trench, the layer of dielectric material having a recess therein that lands on a backside of the gate dielectric that is on the bottom surface of the gate trench;

a dielectric liner within the recess and along a bottom surface of the layer of dielectric material; and a dielectric fill within at least a portion of a remaining volume of the recess, such that the dielectric liner is between the layer of dielectric material and the dielectric fill.

16. The integrated circuit of claim 15, wherein sidewalls of the recess within the layer of dielectric material are co-linear with sidewalls of the nanowire or nanoribbon.

17. The integrated circuit of claim 15, wherein the gate dielectric comprises a first layer and a second layer that is on the first layer, the second layer including a high-k dielectric material.

18. The integrated circuit of claim 17, wherein the remaining volume of the recess includes a volume that is devoid of solid material.

19. The integrated circuit of claim 15, further comprising a source or drain region, wherein the nanowire or nanoribbon extends from the source or drain region.

20. The integrated circuit of claim 19, wherein a bottom portion of the source or drain region is laterally between portions of the dielectric liner.

* * * * *